United States Patent [19]
Park et al.

[11] Patent Number: 5,926,724
[45] Date of Patent: Jul. 20, 1999

[54] DEVICE ISOLATION TECHNOLOGY

[75] Inventors: In-Ok Park; Tae-Youn Park, both of Ichon, Rep. of Korea

[73] Assignee: Hyundai Electronics Industries Co., Ltd., Kyoungki-Do, Rep. of Korea

[21] Appl. No.: 08/756,893

[22] Filed: Dec. 2, 1996

[30] Foreign Application Priority Data

Dec. 2, 1995 [KR] Rep. of Korea ............... 95-46244

[51] Int. Cl.⁶ ..................................................... H01L 21/76
[52] U.S. Cl. ..................... 438/439; 438/448; 438/907; 438/913; 438/763
[58] Field of Search .................................. 438/439, 448, 438/FOR 229, 907, 908, 913, 763

[56] References Cited

U.S. PATENT DOCUMENTS

| | | | |
|---|---|---|---|
| 4,818,235 | 4/1989 | Chao | 437/61 |
| 4,897,364 | 1/1990 | Nguyen et al. | |
| 4,901,133 | 2/1990 | Curran et al. | |
| 4,951,601 | 8/1990 | Maydan et al. | |
| 5,589,233 | 12/1996 | Law et al. | |
| 5,643,825 | 7/1997 | Gardner et al. | |

FOREIGN PATENT DOCUMENTS

| | | |
|---|---|---|
| 61-210638 | 9/1986 | Japan . |
| 61-247055 | 11/1986 | Japan . |
| 7-130836 | 5/1995 | Japan . |

*Primary Examiner*—George Fourson
*Attorney, Agent, or Firm*—Ware, Fressola, Van Der Sluys & Adolphson LLP

[57] ABSTRACT

Disclosed is a device isolation technology for defining active region of a semiconductor device. An oxide is formed on a semiconductor substrate in a first reaction chamber where a first gas containing silicon and a purge gas exist therein. Afterwards, the first temperature of the first reaction chamber is changed to second temperature by injection of a purge gas. A buffer film is formed on the oxide film in the first reaction chamber at the second temperature by injection of a silicon gas. Thereafter, a silicon nitride layer is formed on the buffer film in a second reaction chamber by injecting a second gas containing silicon. Lastly, field oxides are formed by a LOCOS technique through patterning of the three layers and thermal oxidation of exposed portions.

12 Claims, 2 Drawing Sheets

DEVICE ISOLATION TECHNOLOGY

FIELD OF THE INVENTION

The present invention relates to a process for a semiconductor device, and more particulary, to a process for the isolation of a semiconductor device.

BACKGROUND OF THE INVENTION

With the demand increasing for more complex functions and higher performance in an integrated circuit, there is need to pack as many active devices as densly as possible. Density depends upon not only the area required to isolate one transistor from another and but also the active area of the transistor itself. One conventional method of isolation is the well-known local oxidation of silicon (LOCOS) technology in which active regions are separated by a locally grown field oxide. According to this technology, the degree of isolation depends on the length and depth of the field oxide layer separating the active regions. By increasing either the length or the depth of the field oxide layer, the length of the leakage path between the two active areas is also decreased. However, to increase circuit density, the length of the field oxide layer must also be minimized. Increasing the depth of the field oxide induces a side effect where the edges of the field oxides encroach into the neighboring active regions. The encroachment results in a deformation phenomenon known as "bird's beak".

In order to prevent the "bird's beak" phenomenon, various methods have been provided.

FIGS. 1A and 1B are partial cross-sectional views showing the formation process of a field oxide for the isolation of devices. Referring to FIG. 1A, there is prepared a wafer 10 having a thermal oxide 2, polysilicon layer 3, and silicon nitride layer 4 thereon in that order, wherein the substrate 1 contains impurities therein. The layers stacked on the substrate 1 is prepared as follows.

The substrate 1 is loaded into a diffusion furnace having a high temperature such as 850–950° C. Next, $O_2$ gas and $H_2$ gas are introduced into the diffusion furnace to form a thermal oxide film 2 with a thickness of approximately 150–250 Angstroms on the silicon substrate 1, and then the substrate 1 is withdrawn from the diffusion furnace.

Subsequently, the substrate 1 with the thermal oxide film 2 thereon is loaded into a first low pressure chemical vapor deposition (LPCVD) chamber wherein $SiH_4$ gas is introduced therein. Thereafter using the thermal decomposition of the $SiH_4$ gas, a polysilicon layer 3 having a thickness 400–600 Angstroms is formed on the thermal oxide film 2, wherein the polysilicon layer 3 buffers the stress between silicon substrate 1 and silicon nitride layer 4 being formed. Afterwards, the substrate 1 is withdrawn from the first LPCVD chamber.

Subsequently, the substrate having the thermal oxide 2 and polysilicon layer 3 thereon is loaded into a second LPCVD chamber in order to deposit a silicon nitride film 4. A $NH_3$ gas and dichloro-silane ($DCS:SiH_2Cl_2$) gas are introduced into the second LPCVD chamber, to form a silicon nitride film 4 with a thickness of approximately 1,000–2,000 Angstroms on the polysilicon layer 3.

Afterwards, using the photolithography process, a photoresist pattern (did not shown) is formed on the silicon nitride film 4 so that a predetermind portion of the field oxide layer is exposed. Thereafter the silicon nitride film 4 and the polysilicon layer 3 are etched by using the photoresist pattern, and the photoresist pattern is removed by conventional method.

Finally, the exposed portion is oxidized using the patterned silicon nitride film 4 as a mask to form a field oxide layer 5 as shown in FIG. 1B.

The above-mentioned isolation method, however, has a problem in that the distribution of doped impurities in a silicon substrate 1 is varied with the formation of the thermal oxide. This is because the silicon atoms in the silicon substrate having an impurity distribution of a steady state diffuse out from the surface of the silicon substrate during the formation of the thermal oxide and react with oxygen atoms. Accordingly the distribution characteristic of the doped impurities in the silicon substrate varies.

In addition, the method has a shortcoming in that the surface of the substrate is polluted during the loading and unloading steps between the chambers for the formation of the thermal oxide, polysilicon layer, and silicon nitride layer since each layer is formed at a different deposition apparatus.

SUMMARY OF THE INVENTION

It is an object of the present invention to provide a process for the isolation of semiconductor device wherein there is a reduced exhaust of silicon atoms so that the distribution of impurities is not varied.

A further object of the present invention to provide a process for the isolation of semiconductor device capable of decreasing the generation of pollutants during which the wafer moves between one step and the following step.

In accordance with these and other objects, an oxide is formed on a semiconductor substrate in a first reaction chamber where a first gas containing silicon and a purge gas exist therein. Afterwards, the first temperature of the first reaction chamber is changed to second temperature by injection of a purge gas. A buffer film is formed on the oxide film in the first reaction chamber at the second temperature by injection of a silicon gas. Thereafter, a silicon nitride layer is formed on the buffer film in a second reaction chamber by injecting a second gas containing silicon. Lastly, field oxides are formed by a LOCOS technique through patterning of the three layers and thermal oxidation of exposed portions.

BRIEF DESCRIPTION OF THE DRAWING

These and other features, aspect, and advantages of the present invention will be better understood with regard to the following description, appended claims, and accompanying drawings wherein:

DETAILED DESCRIPTION PREFERRED EMBODIMENT

Figure 1A:
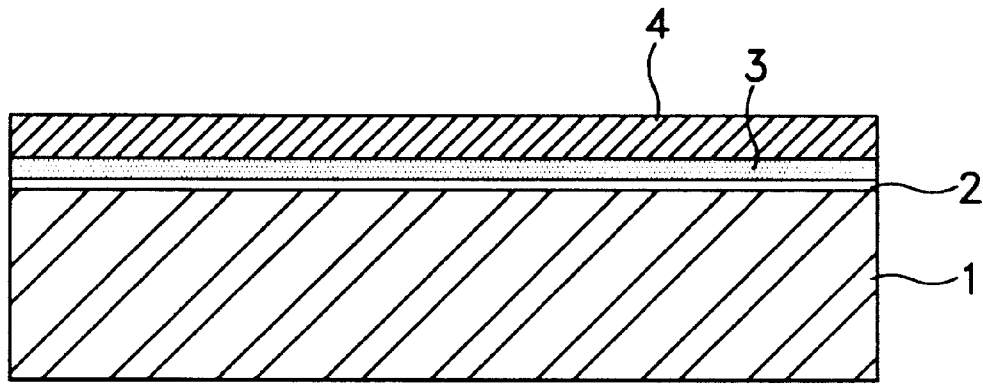
FIGS. 1A to 1B are cross-sectional view for explaining step for manufacturing the field-mask for conventional field oxidizing.
Figure 1B:
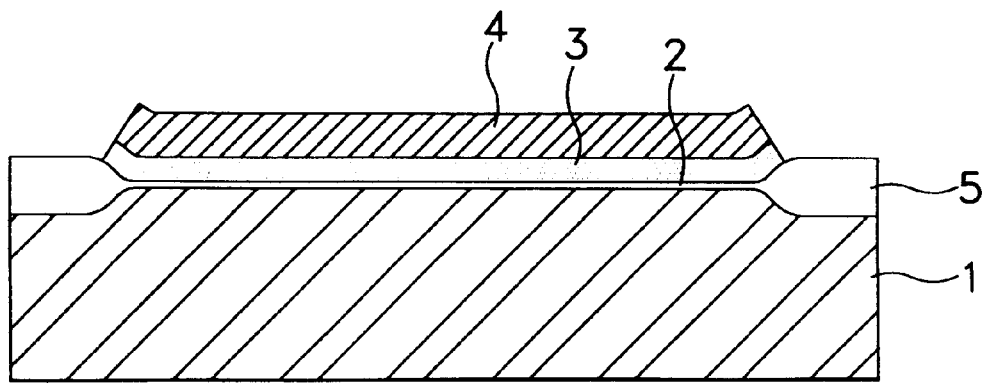
Figure 2A:
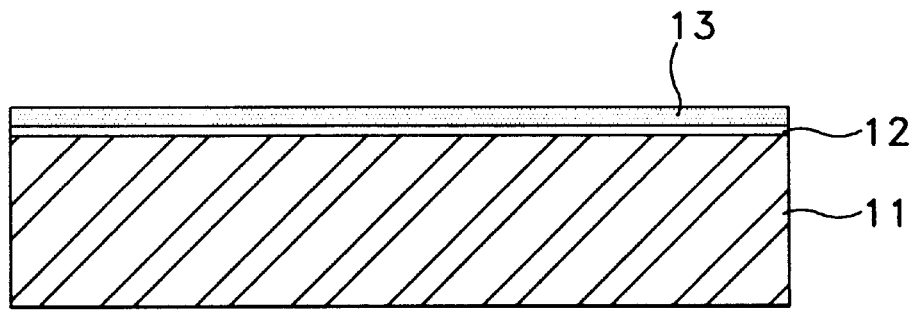
FIGS. 2A to 2C are cross-sectional views for explaining step for manufacturing the field-mask for field oxidizing according to the present invention.

Referring to FIG. 2A, a wafer 11 of the present invention is loaded into a LPCVD chamber having a pressure of 200–700 mTorr and a temperature of 800–850° C. $N_2O$ gas and $SiH_4$ gas are then introduced into the LPCVD chamber until a oxide film 12 having a thickness of 150–200 Angstroms is formed. At that time because the oxide film 12 is formed by the $N_2O$ gas and the $SiH_4$ gas, the silicon atoms are not exhausted.

After the oxide film 12 having a thickness 150–200 Angstroms is formed, the supply of the $SiH_4$ gas is stopped but the $N_2O$ gas continues to be introduced. At this point, the temperature of the LPCVD chamber lowers to a temperature of 600–650° C.

Thereafter, the $SiH_4$ gas is introduced into the LPCVD chamber, and a polysilicon layer 13 having a thickness of 450–550 Angstroms is formed as a buffer film on the oxide film 12 by the thermal decomposition of the $SiH_4$ gas. Therafter, the introduction of $SiH_4$ gas and the $N_2O$ gas is stopped, and the pressure of LPCVD chamber is lowered. Afterwards, the wafer 11 on which the polysilicon layer 13 and oxide film 12 have been formed, is withdrawn and exposed to the surrounding air.

Figure 2B:
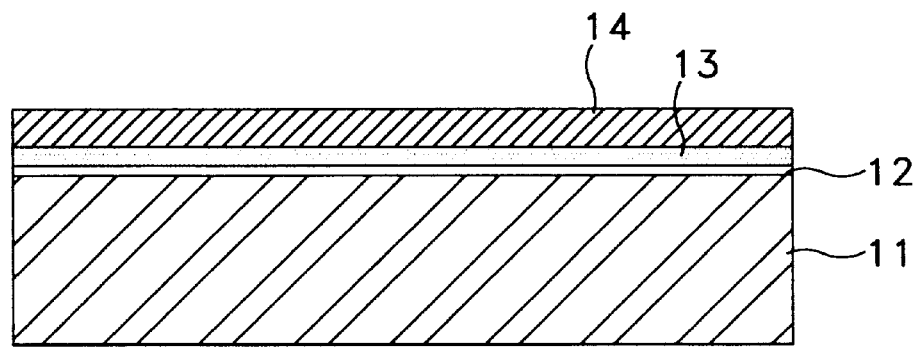

In order to form a silicon nitride film 14, the wafer 11 is loaded into a second LPCVD chamber. Accordingly, as shown in FIG. 2B, a $NH_3$ gas and DCS gas are flowed into the second LPCVD chamber, to form a silicon nitride film 14 with a thickness of 1,000–2,000 Angstroms on the polysilicon layer 13.

Thereafter, the wafer 11 is withdrawn and exposed to the surrounding air. Using the photolithography process, a photoresist pattern (not shown) is formed on the silicon nitride film 14 so that a predetermined portion for forming a field oxide film is exposed. The silicon nitride film 4 and the polysilicon layer are then etched using the photoresist pattern and then the photoresist pattern is removed by conventional method.

Figure 2C:
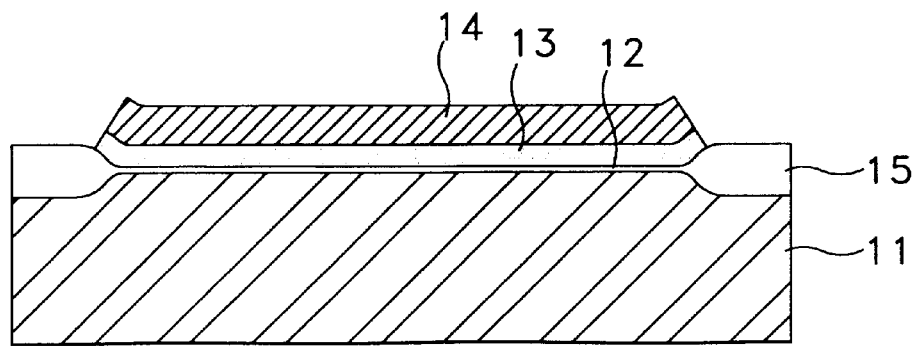

Finally, refering to FIG. 2C, the exposed portion is oxidized by the patterned silicon nitride film 14 as a mask for preventing oxidation, to form a field oxide layer 15.

As apparent from the above description, the present invention prevents the exhaustion of the silicon atom from the silicon substrate to ensure the uniform distribution of the impurities. In addition, the oxide film and the polysilicon layer are formed in the same deposition chamber, therefore the pollution is avoided by not moving of the wafer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A process for the isolation of semiconductor device comprising the steps of:

forming an oxide film on a semiconductor substrate in a first reaction chamber having an atmosphere in which a first gas containing silicon and a purge gas exist, at a first temperature;

changing the first temperature to a second temperature by continuously introducing the purge gas into the first reaction chamber while maintaining a substantially constant pressure level within the first reaction chamber;

injecting the first gas into the first reaction chamber to form a buffer film on the oxide film;

withdrawing the substrate having the buffer film thereon from the first reaction chamber;

loading the substrate into a second reaction chamber under an atmosphere of a gas containing nitrogen;

injecting a second gas containing silicon into the second reaction chamber to form a silicon nitride film on the buffer film;

patterning the silicon nitride film, the buffer film and the oxide film such that a portion of the substrate for forming a field oxide region is exposed; and field-oxidizing the exposed portion using the patterned silicon nitride film as a mask for the formation of field oxide.

2. The process as claimed in claim 1, wherein the first temperature for forming the oxide film is 800–850° C.

3. The process as claimed in claim 1, wherein the first gas is a $SiH_4$ gas, and the purge gas is a $N_2O$ gas.

4. The process as claimed in claim 1, wherein a thickness of the oxide film is 150–200 Angstroms.

5. The process as claimed in claim 1, wherein the second temperature is 600–650° C.

6. The process as claimed in claim 1, wherein the buffer film is formed by thermal decomposition of a silicon gas.

7. The process as claimed in claim 1, wherein the buffer film is a polysilicon.

8. The process as claimed in claim 1, wherein thickness of the buffer film is 400–600 Angstroms.

9. The process as claimed in claim 1, wherein the gas containing nitrogen is $NH_3$ gas and the second gas is $SiH_2Cl_2$ gas.

10. The process as claimed in claim 1, wherein thickness of the silicon nitride film is 400–600 Angstroms.

11. The process as claimed in claim 1, wherein the oxide film and the buffer film are successively formed in the first reaction chamber without breaking the vacuum state.

12. The process as claimed in claim 1, wherein both of the first and second reaction chambers are low pressure chemical vapor deposition (LPCVD) chambers.

* * * * *